(12) United States Patent
Park

(10) Patent No.: US 8,783,933 B2
(45) Date of Patent: Jul. 22, 2014

(54) LIGHT EMITTING DEVICE PACKAGE, AND DISPLAY APPARATUS AND LIGHTING SYSTEM HAVING THE SAME

(71) Applicant: Sung Ho Park, Seoul (KR)

(72) Inventor: Sung Ho Park, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 14/015,589

(22) Filed: Aug. 30, 2013

(65) Prior Publication Data

US 2013/0343068 A1   Dec. 26, 2013

Related U.S. Application Data

(63) Continuation of application No. 13/042,784, filed on Mar. 8, 2011, now Pat. No. 8,540,387.

(30) Foreign Application Priority Data

Mar. 9, 2010  (KR) .................. 10-2010-0020834

(51) Int. Cl.
*F21V 7/04*   (2006.01)

(52) U.S. Cl.
USPC ....................... 362/613; 362/249.02

(58) Field of Classification Search
USPC ..................... 362/613, 97.3, 249.02
See application file for complete search history.

(56) References Cited

U.S. PATENT DOCUMENTS

| 6,060,729 A | 5/2000 | Suzuki et al. |
| 6,531,328 B1 | 3/2003 | Chen |
| 6,835,960 B2 | 12/2004 | Lin et al. |
| 8,049,236 B2 | 11/2011 | Shi et al. |
| 2003/0189830 A1 | 10/2003 | Sugimoto et al. |
| 2008/0130313 A1 | 6/2008 | Kim |
| 2008/0296592 A1 | 12/2008 | Osamu |
| 2009/0278153 A1 | 11/2009 | Cho |
| 2010/0123156 A1* | 5/2010 | Seo et al. ............. 257/99 |

(Continued)

FOREIGN PATENT DOCUMENTS

| EP | 2 048 719 A1 | 4/2009 |
| JP | 2008-300386 A | 12/2008 |

(Continued)

OTHER PUBLICATIONS

Korean Notice of Allowance dated Jan. 18, 2012 issued in Application No. 10-2011-0090714.
U.S. Office Action issued in U.S. Appl. No. 13/042,784 dated Feb. 6, 2013, Mar. 10, 2014.
U.S. Notice of Allowance issued in U.S. Appl. No. 13/042,784 dated May 23, 2013.

*Primary Examiner* — Evan Dzierzynski
(74) *Attorney, Agent, or Firm* — KED & Associates, LLP

(57) ABSTRACT

Disclosed are a light emitting device package, and a display apparatus and a lighting system having the same. The light emitting device package includes a body having a recess, a light emitting device received in the recess, and a lead frame connected to the light emitting device. The lead frame includes a bottom frame formed on a bottom surface of the recess, a first side-wall frame formed on a side wall of the recess, and a second side-wall frame formed on a side wall of the recess and bent at a predetermined angle. The second side-wall frame includes a side-wall portion positioned on the side wall of the recess and a protrusion portion bent from the side-wall portion, and the protrusion portion of the second side-wall frame is positioned on a top surface of the body.

20 Claims, 7 Drawing Sheets

(56) References Cited

U.S. PATENT DOCUMENTS

2010/0123159 A1* 5/2010 Song et al. .................. 257/99
2010/0220463 A1   9/2010 Kim et al.
2010/0270576 A1* 10/2010 Ryo et al. ................... 257/99
2010/0314654 A1* 12/2010 Hayashi ...................... 257/99

FOREIGN PATENT DOCUMENTS

| KR | 20-0353789 Y1 | 6/2004 |
| KR | 10-0634189 B1 | 10/2006 |
| KR | 10-2008-0023389 A | 3/2008 |
| KR | 10-2009-0116351 A | 11/2009 |

* cited by examiner

LIGHT EMITTING DEVICE PACKAGE, AND DISPLAY APPARATUS AND LIGHTING SYSTEM HAVING THE SAME

CROSS-REFERENCE TO RELATED APPLICATION(S)

This application is a Continuation of co-pending application Ser. No. 13/042,784 filed on Mar. 8, 2011, which claims the benefit under 35 U.S.C. §119 of Korean Patent Application No. 10-2010-0020834, filed Mar. 9, 2010, which are hereby incorporated by reference in their entirety.

BACKGROUND

The embodiment relates to a lighting emitting device package and a display apparatus and a lighting system having the same.

A light emitting diode (LED) may constitute a light emitting source by using GaAs, AlGaAs, GaN, InGaN, and InGaAlP-based compound semiconductor materials, thereby representing various colors.

The characteristic of such an LED may be determined according to the material of a compound semiconductor, the color and the brightness of the emitted light, and the intensity range of the brightness. In addition, the LED is packaged and applied to various fields such as a lighting indicator producing various colors, a character indicator, and an image indicator and the like. The above references are incorporated by reference herein where appropriate for appropriate teachings of additional or alternative details, features and/or technical background.

SUMMARY

The embodiment provides a light emitting device package capable of improving a heat dissipation characteristic by lead frames, and a display apparatus and a lighting system having the same.

The embodiment provides a light emitting device package capable of effectively dissipating heat emitted from the light emitting device by lead frames formed on side walls of a recess as well as a bottom surface of the recess, and a display apparatus and a lighting system having the same.

According to the embodiment, a light emitting device package comprises a body having a recess, a light emitting device received in the recess, and a lead frame connected to the light emitting device. The lead frame comprises a bottom frame formed on a bottom surface of the recess, a first side-wall frame formed on a side wall of the recess, and a second side-wall frame formed on a side wall of the recess and bent at a predetermined angle. The second side-wall frame comprises a side-wall portion positioned on the side wall of the recess and a protrusion portion bent from the side-wall portion, and the protrusion portion of the second side-wall frame is positioned on a top surface of the body.

According to the embodiment, a display apparatus comprises a light emitting apparatus comprising at least one light emitting device package, a light guide plate provided on the light emitting apparatus, and a display panel provided on the light guide plate. The light emitting device package comprises a body having a recess, a light emitting device provided in the recess, and a lead frame connected to the light emitting device. The lead frame comprises a bottom frame formed on a bottom surface of the recess, a first side-wall frame formed on a side wall of the recess, and a second side-wall frame formed on a side wall of the recess and bent at a predetermined angle. The second side-wall frame comprises a side-wall portion positioned on the side wall of the recess and a protrusion portion bent from the side-wall portion, and the protrusion portion of the second side-wall frame is positioned on a top surface of the body.

According to the embodiment, a lighting system comprises a case, a light emitting module provided in the case and including at least one light emitting device package, and a connection terminal provided in the case to receive power from an external power source. The light emitting device package comprises a body having a recess therein, a light emitting device received in the recess, and a lead frame connected to the light emitting device. The lead frame comprises a bottom frame formed on a bottom surface of the recess, a first side-wall frame formed on a side wall of the recess, and a second side-wall frame formed on a side wall of the recess and bent at a predetermined angle. The second side-wall frame comprises a side-wall portion positioned on the side wall of the recess and a protrusion portion bent from the side-wall portion, and the protrusion portion of the second side-wall frame is positioned on a top surface of the body.

The embodiment can provide a light emitting device package realizing superior heat dissipation characteristic, and a display apparatus and a lighting system having the same.

DETAILED DESCRIPTION

Figure 1:
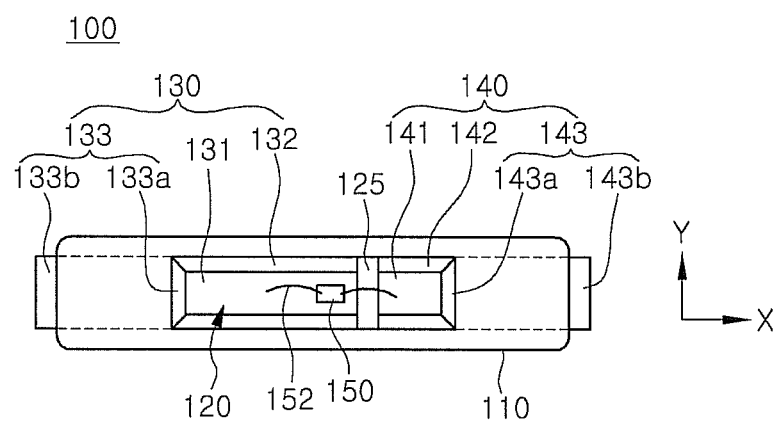
FIG. 1 is a front view showing a light emitting device package according to the embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

Hereinafter, the embodiment will be described with reference to accompanying drawings.

Figure 2:
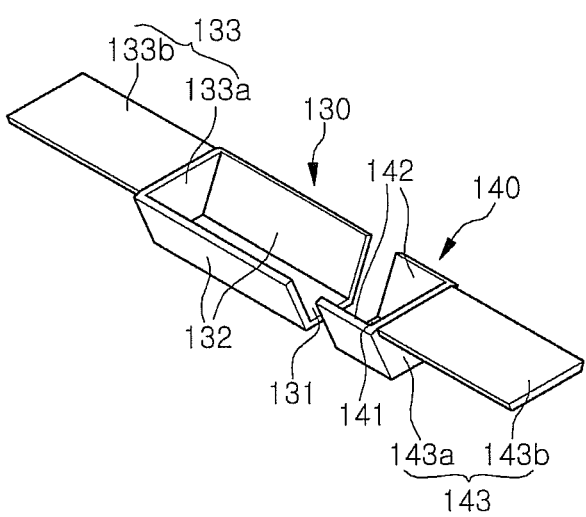
FIG. 2 is a perspective view showing a lead frame of FIG. 1.
Figure 3:
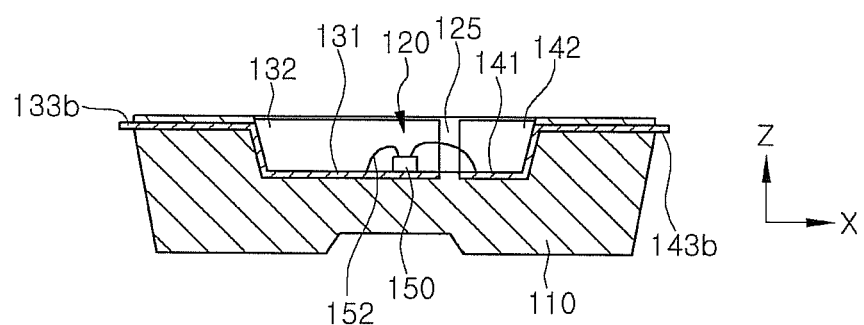
FIG. 3 is a sectional view taken along an axis X of FIG. 1.

FIG. 1 is a plan view showing a light emitting device package according to the embodiment, and FIG. 2 is a perspective view showing a lead frame of FIG. 1. FIG. 3 is a sectional view taken along an axis X of FIG. 1.

Referring to FIGS. 1 to 3, a light emitting device package 100 according to the embodiment may comprise a side-emission-type light emitting device package or a top emission-type light emitting device package, and may have the shape of a polygon such as a rectangular or a cube hexahedron. The light emitting device package 100 may be applied to lighting system fields such as a backlight unit or a light source of a liquid crystal display as a light unit. Hereinafter, the side emission-type light emitting device package will be representatively described for the purpose of explanation.

The light emitting device package 100 comprises a body 110 having a recess 120, lead frames 130 and 140, and a light emitting device 150.

For instance, the body 110 may comprise one selected from the group consisting of polyphthal amide (PPA), polyamide 9T (PA9T), liquid crystal polymer (LCP), and syndiotactic polystyrene (SPS).

The recess 120 is formed at a predetermined depth on the top surface of the body 110.

In this case, when a first direction of the body 110 is referred to as an X axis direction, and a second direction of the body 110 is referred to as a Y axis direction, the length of the body 110 in the X axis direction may be greater than the width of the body 110 in the Y axis direction. However, the embodiment is not limited thereto.

The lead frames 130 and 140 are injection-molded at an upper portion of the body 110, and a portion of the lead frames 130 and 140 may be exposed from the recess 120.

In particular, the lead frames 130 and 140 are formed on lateral sides of a space formed by the recess 120 as well as the bottom surface of the recess 120.

Referring to FIG. 2, the structure of the lead frames 130 and 140 according to the present embodiment will be described in detail.

The lead frames 130 and 140 comprise bottom frames 131 and 141 of the recess 120, first side-wall frames 132 and 142, and second side-wall frames 133 and 143 provided at the side walls of the recess 120. Each end portion of the second side-wall frames 133 and 143 may penetrate through the body 110 in the X axis direction and serve as external electrodes.

The first and second side-wall frames 132, 133, 142 and 143 may be inclined at a predetermined angle outward from a Z axis perpendicular to the bottom frames 131 and 141.

The lead frames 130 and 140 may comprise one selected from the group consisting of iron (Fe), tin (Sn), chromium (Cr), zinc (Zn), nickel (Ni), aluminum (Al), silver (Ag), gold (Au), copper (Cu), and the alloy thereof. In particular, the lead frames 130 and 140 may comprise metal capable of effectively dissipating heat emitted from the light emitting device 150 as the light emitting device 150 is driven.

The first side-wall frames 132 and 142 may be inclined at a predetermined angle with respect to the bottom frames 131 and 141. The second side-wall frames 133 and 143 may be inclined at a predetermined angle with respect to the bottom frames 131 and 141. The inclination of the first and second side-wall frames 132, 133, 142, and 143 is determined according to the shape of the internal wall of the recess 120 formed in the body 110.

The second side-wall frames 133 and 143 comprises side-wall portions 133a and 143a formed on one lateral sides of the recess 120 and protrusion portions 133b and 143b which are bent from the side-wall portions 133a and 143a and serve as external electrodes.

The side-wall portions 133a and 143a of the second side-wall frames 133 and 143 may be integrated with the first side-wall frames 132 and 142 and surround all side walls of the recess 120.

The protrusion portions 133b and 143b of the second side-wall frames 133 and 143 may protrude at a height substantially same to the heights of the first side-wall frames 132 and 142 or at a height lower than the heights of the first side-wall frames 132 and 142. The protrusion portions 133b and 143b of the second side-wall frames 133 and 143 may penetrate through the body 110 or may be formed on the body 110 according to the height of the point from which the protrusion portions 133b and 143b are bent.

Figure 4:
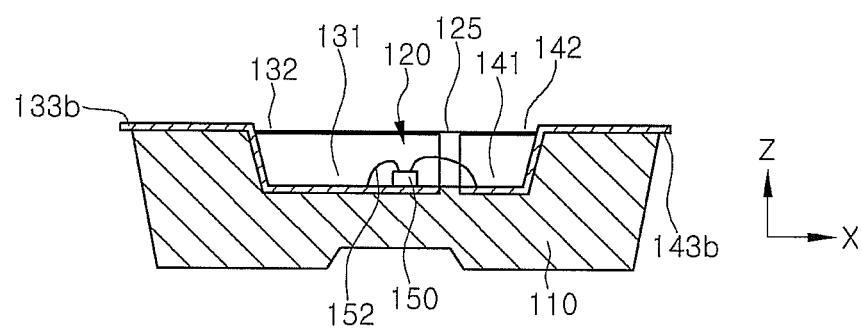
FIG. 4 is a sectional view showing a light emitting device package according to another embodiment.

According to the embodiment of the present invention, as shown in FIGS. 1 to 3, the protrusion portions 133b and 143b of the second side-wall frames 133 and 143 penetrate through the upper portion of the body 110. According to another embodiment of the present invention, as shown in FIG. 4, the protrusion portions 133b and 143b of the second side-wall frames 133 and 143 are positioned on the top surface of the body 110.

In order to allow the protrusion portions 133b and 143b of the second side-wall frame of the lead frames 130 and 140 to penetrate through a portion of the body 110 according to the embodiment of the present invention, after manufacturing a lead frame having a shape shown in FIG. 2, the body 110 having a groove is molded such that the protrusion portions 133b and 143b can penetrate through the groove. In this case, as shown in FIG. 3, portions (i.e., protrusion portions 133b and 143b) of the second side-wall frames 133 and 143 penetrate through the body 110 to be exposed out of the body 110.

The bottom frames 131 and 141 are positioned on the bottom surface of the recess 120 formed in the body 110, and the first side-wall frames 132 and 142 are positioned on the two surfaces of the internal side walls of the recess 120. The second side-wall frames 133 and 143 are positioned on at least one of the internal side walls of the recess 120.

Since the lead frames 130 and 140 having the above structure have superior thermal conductivity due to the characteristic of the material thereof, heat can be very effectively dissipated out of the package.

The lead frames 130 and 140 may be integrated with each other inside the recess 120 and may have different lengths. The thickness of the lead frames 130 and 140 may be in the range of about 20 μm to about 300 μm In addition, a separation film 125 may be formed between the lead frames 130 and 140. The separation film 125 constitutes a portion of the body 110 and separates the lead frames 130 and 140 from each other. Accordingly, the lead frames 130 and 140 can reflect the light while acting as an electrode. In addition, the lead frames 130 and 140 can dissipate heat.

Both side walls of the recess 120 in the X axis direction, that is, the left/right side walls of the recess 120 constitute portions of the body and are inclined at a predetermined angle. In addition, the side walls on which the second side-wall frames 133 and 143 are positioned may be inclined. The separation film 125 provided in the recess 120 and the internal side walls of the recess are simultaneously formed when the body 110 is molded.

The light emitting device 150 is provided at least one of the lead frames 130 and 140 provided in the recess 120, and may be electrically connected to the lead frames 130 and 140. The light emitting device 150 may be mounted on the lead frames 130 and 140 through a wire bonding scheme, a flip bonding scheme, or a die bonding scheme.

The light emitting device 150 may include a compound semiconductor of a group III-V element and include at least one of AlGaN, GaN, InGaAlP, and GaAs-based LED chips. In addition, a protective device such as a zener diode may be mounted in order to protect the light emitting device 150.

Meanwhile, the light emitting device package 100 may be realized as a white light emitting device by using a blue LED chip, a yellow luminescence material (e.g., a silicate-based luminescence material), an orange luminescence material, a green luminescence material, and a red luminescence material according to the realization type. In addition, the light emitting device package 100 may be realized as a light source realized through the combination of at least one or more of a red LED chip, a green LED chip, a blue LED chip, a yellow LED chip, and a UV LED chip.

In addition, a resin member may be molded in the recess 120 in order to protect the light emitting device 150. The resin member may comprise transparent epoxy or transparent silicone, and may be molded by adding luminescence powder if necessary. The resin member may comprise selectively molding liquid or additives according to a use purpose, a use environment, and the characteristic of a product. The surface of the resin member may be formed in one of a flat shape, a concave lens shape, and a convex lens shape.

FIG. 4 is a sectional view showing a light emitting device package according to another embodiment of the present invention.

As described above, the protrusion portions 133b and 143b of the second side-wall frames 133 and 143 may be positioned on the top surface of the body 110 according to positions at which the second side-wall frames 133 and 143 of the lead frames 130 and 140 are bent.

In this case, portions of the lead frames 130 and 140 are provided on the top surface of the body 110, so that the area of the lead frames 130 and 140 exposed to the outside is increased. Accordingly, a heat dissipation characteristic can be more improved by the lead frames 130 and 140.

A plurality of light emitting device packages according to the embodiment (embodiments) may be arrayed and used as light sources of an indicator (signal lamps), a lighting apparatus (headlight of a vehicle, fluorescent lamps, and street lamps), and a display apparatus (e.g., electric sign boards and LCD panels). In addition, the embodiment may be selectively adapted to another embodiment, and the present invention is not limited thereto.

Figure 5:
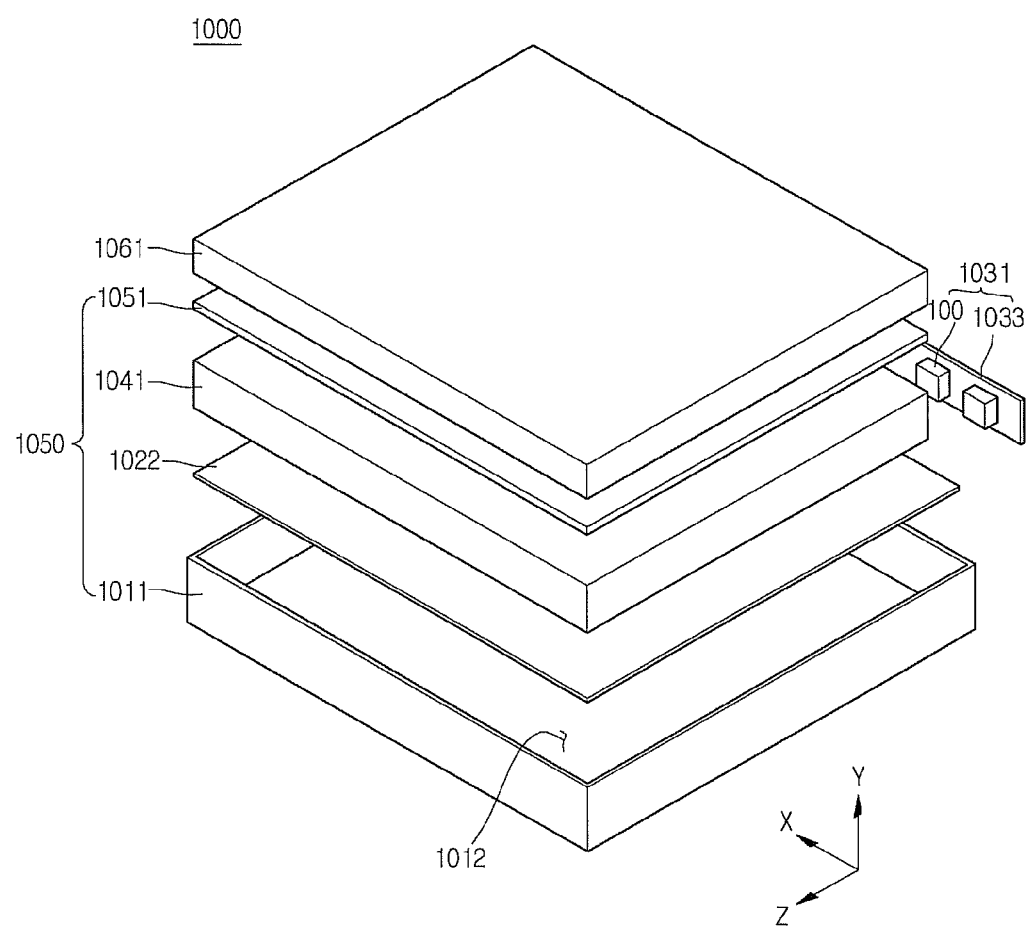
FIG. 5 is a view showing a display apparatus according to the embodiment.

FIG. 5 is an exploded perspective view showing a display apparatus according to the embodiment.

Referring to FIG. 5, the display apparatus 1000 according to the embodiment comprises a light guide plate 1041, a light emitting module 1031 for supplying the light to the light guide plate 1041, a reflective member 1022 provided below the light guide plate 1041, an optical sheet 1051 provided on the light guide plate 1041, a display panel 1061 provided on the optical sheet 1051, and a bottom cover 1011 for receiving the light guide plate 1041, the light emitting module 1031, and the reflective member 1022. However, the embodiment is not limited to the above structure.

The bottom cover 1011, the reflective member 1022, the light guide plate 1041 and the optical sheet 1051 may constitute a light unit 1050.

The light guide plate 1041 diffuses the light to provide surface light. The light guide plate 1041 may comprise transparent material. For instance, the light guide plate 1041 may comprise one of acryl-based resin such as PMMA (polymethyl methacrylate, PET (polyethylene terephthalate), PC (polycarbonate), COC (cyclic olefin copolymer) and PEN (polyethylene naphthalate) resin.

The light emitting module 1031 may be disposed on the light guide plate 1041 to supply the light to the light guide plate 1041. In other words, the light emitting module 1031 may be disposed in at one side of the light guide plate 1041. The light emitting module 1031 serves as the light source of the display apparatus.

At least one light emitting module 1031 is provided to directly or indirectly supply the light from one side of the light guide plate 1041. The light emitting module 1031 may comprise a substrate 1033 and light emitting device packages 100 according to the embodiments. The light emitting device and the light emitting device packages 100 may be arrayed on the substrate 1033 while being spaced apart from each other at the predetermined interval. In other words, light emitting devices may be arrayed on the substrate 1033 in the form of a chip or a package.

The substrate 1033 may comprise a printed circuit board (PCB) including a circuit pattern. In addition, the substrate 1033 may comprise a metal core PCB (MCPCB) or a flexible PCB (FPCB) as well as a typical PCB, but the embodiment is not limited thereto. If the light emitting device package 100 is installed on the side of the bottom cover 1011 or on a heat dissipation plate, the substrate 1033 may be omitted. The heat dissipation plate partially makes contact with the top surface of the bottom cover 1011.

In addition, the light emitting device package 100 may be arranged on the substrate 1033 such that a light extraction surface of the light emitting device package 100 is spaced apart from the light guide plate 1041 by a predetermined distance, but the embodiment is not limited thereto. The light emitting device package 1000 may directly or indirectly supply the light to a light incident surface, which is one side of the light guide plate 1041, but the embodiment is not limited thereto.

The reflective member 1022 may be disposed below the light guide plate 1041. The reflective member 1022 reflects the light, which travels downward through the bottom surface of the light guide plate 1041, upward, thereby improving the brightness of the light unit 1050. For instance, the reflective member 1022 may comprise PET, PC or PVC resin, but the embodiment is not limited thereto. The reflective member 1022 may serve as the top surface of the bottom cover 1011, but the embodiment is not limited thereto.

The bottom cover 1011 may receive the light guide plate 1041, the light emitting module 1031, and the reflective member 1022. To this end, the bottom cover 1011 may have a receiving section 1012 having a box shape with an opened top surface, but the embodiment is not limited thereto. The bottom cover 1011 can be coupled with the top cover, but the embodiment is not limited thereto.

The bottom cover 1011 can be manufactured through a press process or an extrusion process by using metallic material or resin material. In addition, the bottom cover 1011 may comprise metal or non-metallic material having superior thermal conductivity, but the embodiment is not limited thereto.

The display panel 1061, for instance, is an LCD panel including first and second transparent substrates, which are opposite to each other and comprise a transparent material, and a liquid crystal layer interposed between the first and second substrates. A polarizing plate can be attached to at least one surface of the display panel 1061, but the embodiment is not limited thereto. The display panel 1061 displays information by a light passing through an optical sheet 1051. The display apparatus 1000 can be applied to various portable terminals, monitors of notebook computers, monitors of laptop computers, and televisions.

The optical sheet 1051 may be disposed between the display panel 1061 and the light guide plate 1041, and comprise at least one transmissive sheet. For instance, the optical sheet 1051 comprises at least one of a diffusion sheet, a horizontal and vertical prism sheet, and a brightness enhanced sheet. The diffusion sheet diffuses the incident light, the horizontal and vertical prism sheet concentrates the incident light onto the display panel 1061, and the brightness enhanced sheet improves the brightness by reusing the lost light. In addition, a protective sheet may be provided on the display panel 1061, but the embodiment is not limited thereto.

The light guide plate 1041 and the optical sheet 1051 may be provided in the light path of the light emitting module 1031 as optical members, but the embodiment is not limited thereto.

Figure 6:
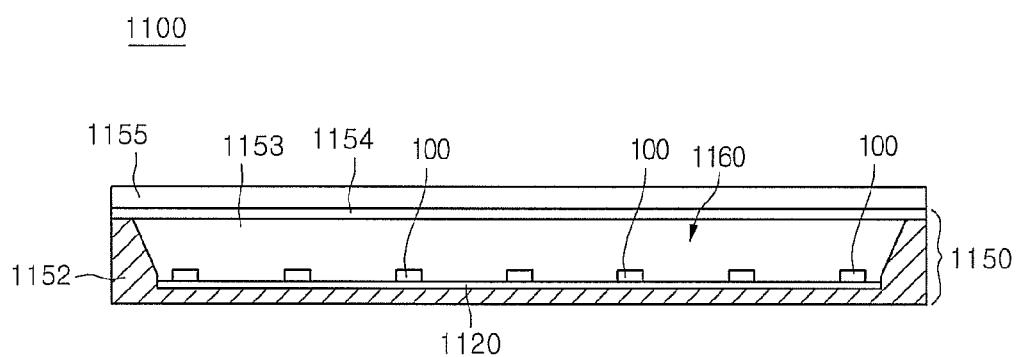
FIG. 6 is a view showing another example of the display apparatus according to the embodiment.

FIG. 6 is a sectional view showing the display apparatus according to the embodiment. The package disclosed in the description referring to FIG. 6 comprises light emitting devices arrayed in the form of a chip or a package.

Referring to FIG. 6, the display apparatus 1100 comprises a bottom cover 1152, a substrate 1120 on which the light emitting device packages 100 are arrayed, an optical member 1154, and a display panel 1155.

The substrate 1120 and the light emitting device packages 100 may constitute the light emitting module 1031. In addition, the bottom cover 1152, at least one light emitting module 1031, and the optical member 1154 may constitute the light unit. Light emitting devices may be arrayed on the substrate 1120 in the form of a chip or a package.

The bottom cover 1151 can be provided with a receiving section 1153, but the embodiment is not limited thereto.

The optical member 1154 may comprise at least one of a lens, a light guide plate, a diffusion sheet, a horizontal and vertical prism sheet, and a brightness enhanced sheet. The light guide plate may comprise PC or PMMA (Poly methyl methacrylate). The light guide plate may be omitted. The diffusion sheet diffuses the incident light, the horizontal and vertical prism sheet concentrates the incident light onto the display panel 1155, and the brightness enhanced sheet improves the brightness by reusing the lost light.

Figure 7:
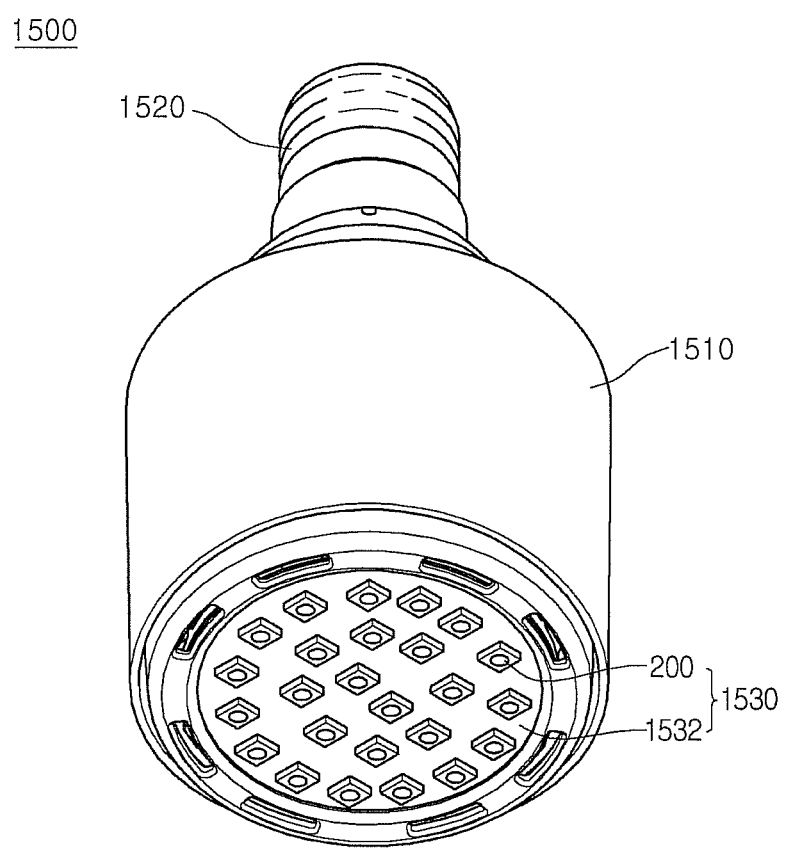
FIG. 7 is a view showing a lighting system according to the embodiment.

FIG. 7 is a perspective view showing a lighting system 1500 according to the embodiment.

Referring to FIG. 7, the lighting system 1500 comprises a case 1510, a light emitting module 1530 installed in the case 1510, and a connection terminal 1520 installed in the case 1510 to receive power from an external power source.

Preferably, the case 1510 comprises material having superior heat dissipation property. For instance, the case 1510 comprises metallic material or resin material.

The light emitting module 1530 may comprise a substrate 1532 and a light emitting device or light emitting device package 200 according to the embodiment installed on the substrate 1532. The light emitting device packages 200 are spaced apart from each other or arranged in the form of a matrix. Light emitting devices may be arrayed on the substrate 1532 in the form of a chip or a package.

The substrate 1532 comprises an insulating member printed with a circuit pattern. For instance, the substrate 1532 comprises a PCB, an MCPCB, an FPCB, a ceramic PCB, and an FR-4 substrate.

In addition, the substrate 1532 may comprise material that effectively reflects the light. A coating layer can be formed on the surface of the substrate 1532. At this time, the coating layer has a white color or a silver color to effectively reflect the light.

At least one light emitting device package 200 may be installed on the substrate 1532. Each light emitting device package 200 may comprise at least one LED (light emitting diode) chip. The LED chip may comprise an LED that emits the light of visible ray band having red, green, blue or white color and a UV (ultraviolet) LED that emits UV light.

The light emitting device packages 200 of the light emitting module 1530 can be variously arranged to provide various colors and brightness. For instance, the white LED, the red LED and the green LED may be arranged to achieve the high color rendering index (CRI).

The connection terminal 1520 is electrically connected to the light emitting module 1530 to supply power to the light emitting module 1530. The connection terminal 1520 has a shape of a socket screw-coupled with the external power source, but the embodiment is not limited thereto. For instance, the connection terminal 1520 may be prepared in the form of a pin inserted into the external power source or connected to the external power source through a wire.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package comprising:
a body having a recess;
a light emitting device provided in the recess;
a first lead frame under the light emitting device; and
a second lead frame connected to the light emitting device and spaced apart from the first lead frame,
wherein the first lead frame comprises a first bottom frame formed on a bottom surface of the recess, a first side-wall frame formed on a side wall of the recess, and a second side-wall frame formed on a side wall of the recess and bent at a predetermined angle,
wherein the second side-wall frame comprises a first side-wall portion positioned on the side wall of the recess and a first protrusion portion bent from the side-wall portion, and the protrusion portion of the second side-wall frame is positioned on a top surface of the body,
wherein the second lead frame comprises a second bottom frame formed on the bottom surface of the recess, a third side-wall frame formed on a side wall of the recess, and a fourth side-wall frame formed on a side wall of the recess and bent at a predetermined angle,
wherein the fourth side-wall frame comprises a second side-wall portion positioned on the side wall of the recess and a second protrusion portion bent from the second side-wall portion, the second side-wall portion facing the first side-wall portion,
wherein the first lead frame is electrically separated from the second lead frame, and
wherein the first protrusion portion and the second protrusion portion are disposed on the substantially same horizontal plane.

2. The light emitting device package of claim 1, wherein a pair of first side-wall frames extend from the first bottom frame along the side walls of the recess while facing each other.

3. The light emitting device package of claim 1, wherein the second side-wall frame is integrated with the first side-wall frame.

4. The light emitting device package of claim 1, wherein the side wall of the recess provided thereon with the first side-wall frame is inclined.

5. The light emitting device package of claim 1, wherein the side wall of the recess provided thereon with the second side-wall frame is inclined.

6. The light emitting device package of claim 1, wherein the first protrusion portion is disposed higher than the first bottom frame.

7. The light emitting device package of claim 1, wherein the first protrusion portion of the second side-wall frame is bent at a height of the first side-wall frame.

8. A light emitting device package comprising:
a body having a recess;
a light emitting device provided in the recess;
a first lead frame under the light emitting device; and
a second lead frame connected to the light emitting device and spaced apart from the first lead frame,
wherein the first lead frame comprises a first bottom frame formed on a bottom surface of the recess, a first side-wall frame formed on a side wall of the recess, and a second side-wall frame formed on a side wall of the recess and bent at a predetermined angle,
wherein the second side-wall frame comprises a first side-wall portion positioned on the side wall of the recess and a first protrusion portion bent from the side-wall portion,
wherein the second lead frame comprises a second bottom frame formed on the bottom surface of the recess, a third side-wall frame formed on a side wall of the recess, and a fourth side-wall frame formed on a side wall of the recess and bent at a predetermined angle,
wherein the fourth side-wall frame comprises a second side-wall portion positioned on the side wall of the recess and a second protrusion portion bent from the second side-wall portion, the second side-wall portion facing the first side-wall portion, and
wherein the first lead frame is electrically separated from the second lead frame.

9. The light emitting device package of claim 8, wherein a pair of first side-wall frames extend from the first bottom frame along the side walls of the recess while facing each other.

10. The light emitting device package of claim 8, wherein the second side-wall frame is integrated with the first side-wall frame.

11. The light emitting device package of claim 8, wherein the first protrusion portion and the second protrusion portion are disposed on the substantially same horizontal plane.

12. The light emitting device package of claim 8, wherein the side wall of the recess provided thereon with the first side-wall frame is inclined.

13. The light emitting device package of claim 8, wherein the side wall of the recess provided thereon with the second side-wall frame is inclined.

14. The light emitting device package of claim 8, wherein the first protrusion portion is disposed higher than the first bottom frame.

15. The light emitting device package of claim 8, wherein the first protrusion portion of the second side-wall frame is bent at a height of the first side-wall frame.

16. A light emitting device package comprising:
a body having a recess;
a light emitting device provided in the recess;
a first lead frame under the light emitting device; and
a second lead frame connected to the light emitting device,
wherein the first lead frame comprises a first bottom frame formed on a bottom surface of the recess, a first side-wall frame formed on a side wall of the recess, and a second side-wall frame formed on a side wall of the recess and bent at a predetermined angle,
wherein the second side-wall frame comprises a first side-wall portion positioned on the side wall of the recess and a first protrusion portion bent from the side-wall portion,
wherein the second lead frame comprises a second bottom frame formed on the bottom surface of the recess, a third side-wall frame formed on a side wall of the recess, and a fourth side-wall frame formed on a side wall of the recess and bent at a predetermined angle,
wherein the fourth side-wall frame comprises a second side-wall portion positioned on the side wall of the recess and a second protrusion portion bent from the second side-wall portion, the second side-wall portion facing the first side-wall portion,
wherein the first lead frame is electrically separated from the second lead frame,
wherein the first protrusion portion and the second protrusion portion are disposed on the substantially same horizontal plane, and
wherein the first protrusion portion is disposed higher than the first bottom frame.

17. The light emitting device package of claim 16, wherein a pair of first side-wall frames extend from the first bottom frame along the side walls of the recess while facing each other.

18. The light emitting device package of claim 16, wherein the second side-wall frame is integrated with the first side-wall frame.

19. The light emitting device package of claim 16, wherein the side wall of the recess provided thereon with the first side-wall frame is inclined.

20. The light emitting device package of claim 16, wherein the first protrusion portion of the second side-wall frame is bent at a height of the first side-wall frame.

* * * * *